US 6,713,322 B2

(12) United States Patent
Lee (10) Patent No.: US 6,713,322 B2
(45) Date of Patent: Mar. 30, 2004

(54) LEAD FRAME FOR SEMICONDUCTOR PACKAGE

(75) Inventor: Hyung Ju Lee, Seoul (KR)

(73) Assignee: Amkor Technology, Inc., Chandler, AZ (US)

(*) Notice: Subject to any disclaimer, the term of this patent is extended or adjusted under 35 U.S.C. 154(b) by 74 days.

(21) Appl. No.: 10/013,160

(22) Filed: Dec. 10, 2001

(65) Prior Publication Data

US 2002/0140061 A1 Oct. 3, 2002

(30) Foreign Application Priority Data

Mar. 27, 2001 (KR) .......................... 2001-15966

(51) Int. Cl.[7] .................. H01L 23/495; H01L 21/44; H01L 21/48; H01L 21/50
(52) U.S. Cl. .................. 438/123; 257/666; 257/670
(58) Field of Search ................ 257/666, 670; 438/123

(56) References Cited

U.S. PATENT DOCUMENTS

| 3,838,984 | A | 10/1974 | Crane et al. |
| 4,054,238 | A | 10/1977 | Lloyd et al. |
| 4,530,152 | A | 7/1985 | Roche et al. |
| 4,707,724 | A | 11/1987 | Suzuki et al. |
| 4,756,080 | A | 7/1988 | Thorp, Jr. et al. |
| 4,812,896 | A | 3/1989 | Rothgery et al. |
| 5,041,902 | A | 8/1991 | McShane |
| 5,157,480 | A | 10/1992 | McShane et al. |
| 5,172,213 | A | 12/1992 | Zimmerman |
| 5,172,214 | A | 12/1992 | Casto |
| 5,200,362 | A | 4/1993 | Lin et al. |
| 5,200,809 | A | 4/1993 | Kwon |
| 5,214,845 | A | 6/1993 | King et al. |
| 5,216,278 | A | 6/1993 | Lin et al. |
| 5,221,642 | A | 6/1993 | Burns |

(List continued on next page.)

FOREIGN PATENT DOCUMENTS

| DE | 19734794 A1 | 8/1997 |
| EP | 0794572 A2 | 10/1997 |
| JP | 5745959 | 3/1982 |
| JP | 59227143 | 12/1984 |
| JP | 60195957 | 10/1985 |
| JP | 6139555 | 2/1986 |
| JP | 629639 | 1/1987 |
| JP | 63205935 | 8/1988 |
| JP | 63233555 | 9/1988 |
| JP | 1106456 | 4/1989 |
| JP | 692076 | 4/1994 |
| JP | 7312405 | 11/1995 |
| JP | 8125066 | 5/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| KR | 941979 | 1/1994 |
| KR | 9772358 | 11/1997 |

Primary Examiner—Caridad Everhart
Assistant Examiner—Chuong A Luu
(74) Attorney, Agent, or Firm—Stetina Brunda Garred & Brucker (57) ABSTRACT

A semiconductor package including a lead frame comprising a frame including both a ground ring and a chip mounting board located therein. Extending between the ground ring and the chip mounting board are a plurality of elongate slots or apertures. The ground ring is formed to include recesses within the bottom surface thereof which create regions of reduced thickness. A semiconductor chip bonded to the chip mounting board may be electrically connected to leads of the lead frame and to the ground ring via conductive wires. Those conductive wires extending to the ground ring are bonded to the top surface thereof at locations which are not aligned with the recesses within the bottom surface, i.e., those regions of the ground ring of maximum thickness.

21 Claims, 10 Drawing Sheets

U.S. PATENT DOCUMENTS

| | | | | |
|---|---|---|---|---|
| 5,258,094 | A | 11/1993 | Furui et al. | |
| 5,273,938 | A | 12/1993 | Lin et al. | |
| 5,277,972 | A | 1/1994 | Sakumoto et al. | |
| 5,278,446 | A | 1/1994 | Nagaraj et al. | |
| 5,279,029 | A | 1/1994 | Burns | |
| 5,332,864 | A | 7/1994 | Liang et al. | |
| 5,336,931 | A | 8/1994 | Juskey et al. | |
| 5,343,076 | A | 8/1994 | Katayama et al. | |
| 5,406,124 | A | 4/1995 | Morita et al. | |
| 5,424,576 | A | 6/1995 | Djennas et al. | |
| 5,435,057 | A | 7/1995 | Bindra et al. | |
| 5,474,958 | A | 12/1995 | Djennas et al. | |
| 5,521,429 | A | 5/1996 | Aono et al. | |
| 5,604,376 | A | 2/1997 | Hamburgen et al. | |
| 5,608,267 | A | 3/1997 | Mahulikar et al. | |
| 5,639,990 | A | 6/1997 | Nishihara et al. | |
| 5,640,047 | A | 6/1997 | Nakashima | |
| 5,641,997 | A | 6/1997 | Ohta et al. | |
| 5,646,831 | A | 7/1997 | Manteghi | |
| 5,650,663 | A | 7/1997 | Parthasarathi | |
| 5,683,806 | A | 11/1997 | Sakumoto et al. | |
| 5,696,666 | A | 12/1997 | Miles et al. | |
| 5,701,034 | A | 12/1997 | Marrs | |
| 5,710,064 | A | 1/1998 | Song et al. | |
| 5,736,432 | A | 4/1998 | Mackessy | |
| 5,776,798 | A | 7/1998 | Quan et al. | |
| 5,783,861 | A | 7/1998 | Son | |
| 5,835,988 | A | 11/1998 | Ishii | |
| 5,859,471 | A | 1/1999 | Kuraishi et al. | |
| 5,866,939 | A | 2/1999 | Shin et al. | |
| 5,877,043 | A | 3/1999 | Alcoe et al. | |
| 5,894,108 | A | 4/1999 | Mostafazadeh et al. | |
| 5,977,613 | A | 11/1999 | Takata et al. | |
| 5,977,630 | A | 11/1999 | Woodworth et al. | |
| 5,981,314 | A * | 11/1999 | Glenn et al. | 438/127 |
| 5,986,885 | A | 11/1999 | Wyland | |
| 6,001,671 | A | 12/1999 | Fjelstad | |
| 6,025,640 | A | 2/2000 | Yagi et al. | |
| 6,072,228 | A | 6/2000 | Hinkle et al. | |
| RE36,907 | E * | 10/2000 | Templeton et al. | 257/666 |
| 6,130,115 | A | 10/2000 | Okumura et al. | |
| 6,130,473 | A | 10/2000 | Mostafazadeh et al. | |
| 6,140,154 | A | 10/2000 | Hinkle et al. | |
| 6,143,981 | A | 11/2000 | Glenn | |
| 6,198,171 | B1 | 3/2001 | Huang et al. | |
| 6,225,146 | B1 | 5/2001 | Yamaguchi et al. | |
| 6,229,200 | B1 | 5/2001 | Mclellan et al. | |
| 6,242,281 | B1 | 6/2001 | Mclellan et al. | |
| 6,281,568 | B1 | 8/2001 | Glenn et al. | |
| 6,294,100 | B1 | 9/2001 | Fan et al. | |
| 6,326,678 | B1 * | 12/2001 | Karnezos et al. | 257/666 |
| 6,339,252 | B1 * | 1/2002 | Niones et al. | 257/666 |
| 6,501,161 | B1 * | 12/2002 | Lee | 257/676 |
| 6,545,347 | B2 * | 4/2003 | McClellan | 257/690 |
| 6,611,048 | B1 * | 8/2003 | Fazelpour et al. | 257/670 |
| 6,646,339 | B1 * | 11/2003 | Ku et al. | 257/708 |

* cited by examiner

LEAD FRAME FOR SEMICONDUCTOR PACKAGE

CROSS-REFERENCE TO RELATED APPLICATIONS

The present application claims priority to Korean Patent Application No. 2001-15966 filed Mar. 27, 2001.

STATEMENT RE: FEDERALLY SPONSORED RESEARCH/DEVELOPMENT (Not Applicable)

BACKGROUND OF THE INVENTION

Semiconductor chips are typically enclosed in a sealing part that provides protection from hostile environments and enables the semiconductor chip to be electrically connected to a component such as a motherboard. The semiconductor chip, in combination with the sealing part, is typically referred to as a semiconductor package, with the elements of such package including a lead frame, a semiconductor chip, conductive wires, and the hard sealing part. The lead frame is the central supporting structure of the package, with a portion of the lead frame being internal to the sealing part. Some portions of the leads of the lead frame extend from the sealing part and are used to connect the package externally.

In general, a conventional lead frame for a semiconductor package is manufactured by mechanically stamping or chemically etching a continuous metal strip such as one fabricated from copper, a copper alloy, or other metal material. The lead frame serves a dual purpose by acting as a lead connecting the semiconductor chip to an external circuit (e.g., a motherboard) and as a frame which fixes the semiconductor chip on the motherboard at the same time.

A deficiency of conventional lead frames in those semiconductor packages including the same is that many of the leads of the lead frame cannot be used for signal transmission in that they must be used for providing ground to the semiconductor chip. More particularly, the semiconductor chip includes not only input-output pads for power supply and/or signal transmission, but also a plurality of input-output pads for ground. The input-output pads for ground are themselves bonded to respective ones of the leads by the conductive wires, thus preventing the usage of such leads for signal transmission.

To supplement the number of leads for signal transmission (i.e., to add additional signal leads), the leads of the lead frame must be finely pitched. However, such fine pitching is not preferable due to the resultant increases in manufacturing cost. Another alternative that has been developed to supplement the number of signal leads involves a manufacturing method wherein the general size of the lead frame is enlarged. However, the use of an enlarged lead frame necessarily results in an increased volume or enlargement of the semiconductor package incorporating such lead frame. Such semiconductor package fails to satisfy or meet the trend of light, thin, small and short semiconductor package products.

In another attempt to address the problem of insufficient numbers of signal leads, there has been developed a semiconductor package fabrication methodology wherein the conductive wire(s) for ground is/are directly bonded to a peripheral or circumferential portion of the top surface of the chip mounting board or die pad of the lead frame instead of one or more of the leads. During the wire bonding process, the lead frame is typically located on a substantially planar upper surface of a heat block which generates intense heat. The lead frame is fixed to the heat block through the use of a clamp. Subsequent to such affixation, the wire bonding process is performed. However, since the peripheral portion of the top surface of the die pad is not typically in direct contact with the heat block, a severe bouncing phenomenon occurs during the wire bonding process, thereby considerably reducing the yield rate or efficacy of the wire bonding. The bouncing phenomenon occurs as a result of contact with a capillary during the bonding process, and adversely affects the same.

BRIEF SUMMARY OF THE INVENTION

In accordance with the present invention, there is provided a semiconductor package including a lead frame comprising a frame including both a ground ring and a chip mounting board located therein. Extending between the ground ring and the chip mounting board are a plurality of elongate slots or apertures. The ground ring is formed to include recesses within the bottom surface thereof which create regions of reduced thickness. A semiconductor chip bonded to the chip mounting board may be electrically connected to leads of the lead frame and to the ground ring via conductive wires. Those conductive wires extending to the ground ring are bonded to the top surface thereof at locations which are not aligned with the recesses within the bottom surface, i.e., those regions of the ground ring of maximum thickness.

In the lead frame of the present semiconductor package, the ground ring is supported within the frame, and the chip mounting board supported within the ground ring by one or more tie bars which are connected to and extend between the frame, the ground ring, and the chip mounting board. The chip mounting board, the ground ring, the tie bars, the leads, the semiconductor chip, and the conductive wires are at least partially encapsulated by a sealing part. Within the sealing part, certain surfaces of the chip mounting board, the tie bars, the ground ring, and the leads are exposed. The completion of the semiconductor package is facilitated by a saw singulation process wherein excess portions of the lead frame outside the sealing part are removed.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
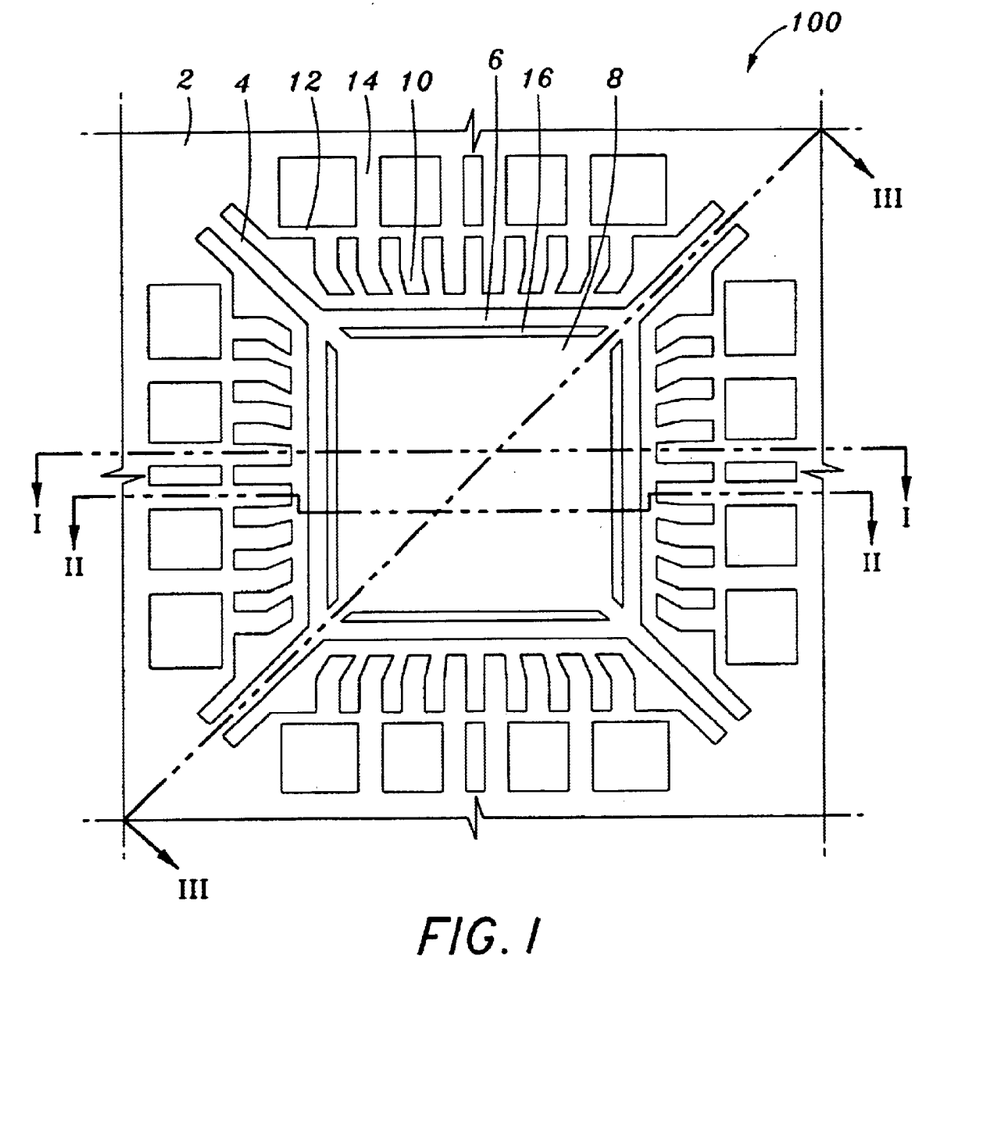
FIG. 1 is a top plan view of a lead frame constructed in accordance with a first embodiment of the present invention.
Figure 2:
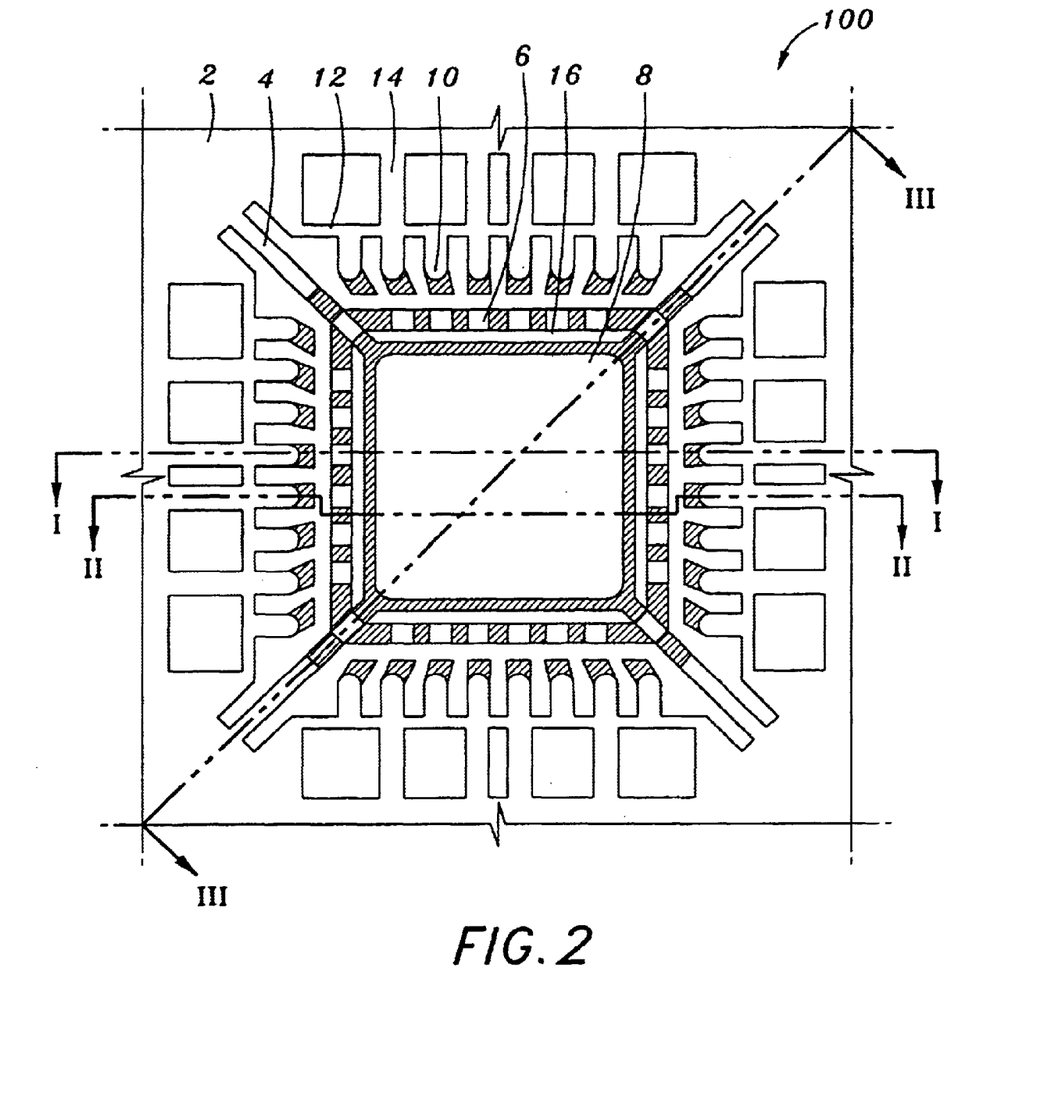
FIG. 2 is a bottom plan view of the lead frame shown in FIG. 1.

Referring now to the drawings wherein the showings are for purposes of illustrating preferred embodiments of the present invention only, and not for purposes of limiting the same, FIGS. 1 and 2 depict top and bottom plan views, respectively, of a lead frame 100 for use in a semiconductor package 200 constructed in accordance with the present invention. The lead frame 100 comprises a frame 2 which is a substantially flat or planar plate. Located inside the frame 2 is a generally square ground ring 6 of the lead frame 100, while located inside the ground ring 6 is a generally square, plate-like die pad or chip mounting board 8. Formed on the inside of the frame 2 are a plurality of tie bars 4 which are connected to and support both the ground ring 6 and the chip mounting board 8. Additionally, formed between the chip mounting board 8 and the ground ring 6 are a plurality of elongate slots 16 which effectively separate the chip mounting board 8 and the ground ring 6 from each other by a fixed interval or gap. More particularly, four slots 16 are included in the lead frame 100, with each defining a prescribed gap or space between each peripheral edge segments or sides of the chip mounting board 8 and a respective side or segment of the ground ring 6. However, it will be recognized that specific areas between the chip mounting board 8 and the ground ring 6 are connected to each other via the tie bars 4.

The lead frame 100 further comprises a plurality of leads 10 which are arranged about the periphery of the ground ring 6. The leads 10 are segregated into four equal sets, with each set being connected to and extending perpendicularly from a respective dambar 12. The opposed ends of each dambar 12 are connected to the frame 2. Each dambar 12 is itself connected to the distal ends of a plurality of supporting leads 14, with the opposed ends of the supporting leads 14 themselves being connected to the frame 2. In FIG. 2, the hatched portions in the drawing indicate partially etched portions of the lead frame 100, and are described as third surfaces below.

Figure 3:
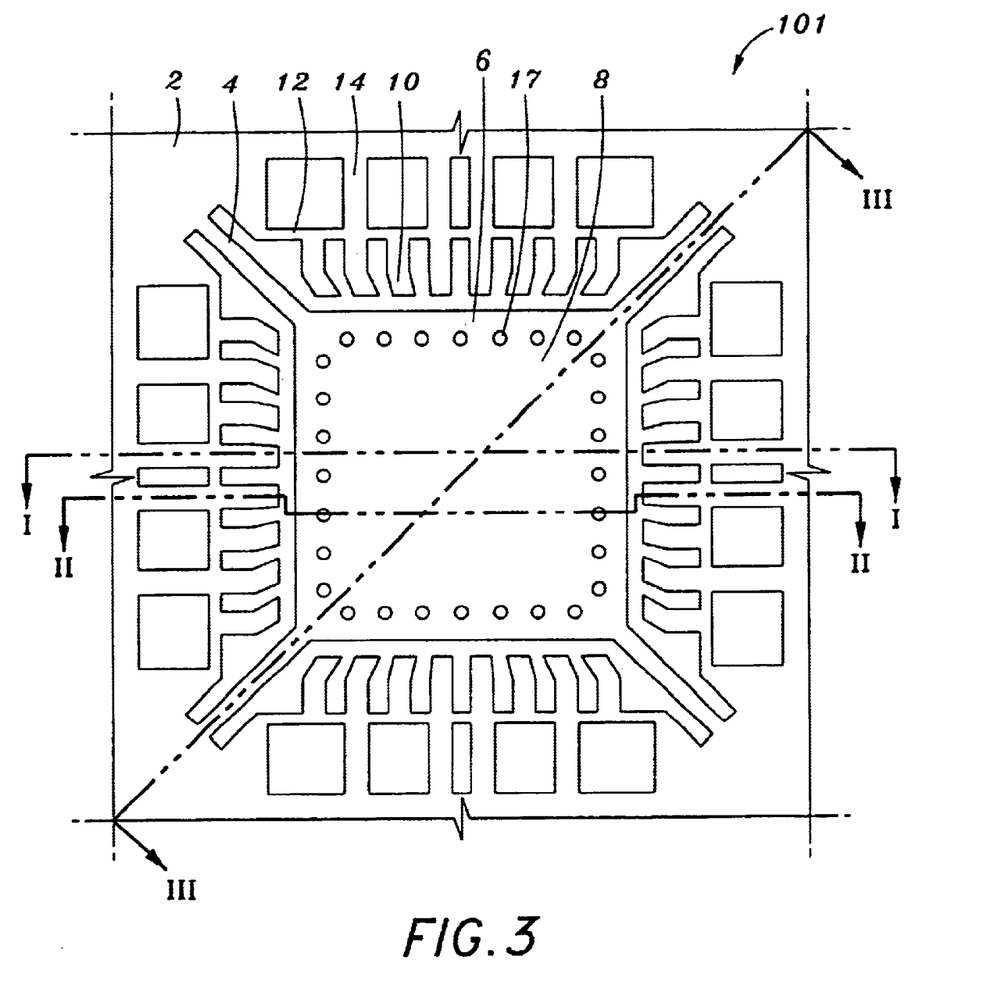
FIG. 3 is a top plan view of a lead frame constructed in accordance with a second embodiment of the present invention.
Figure 4:
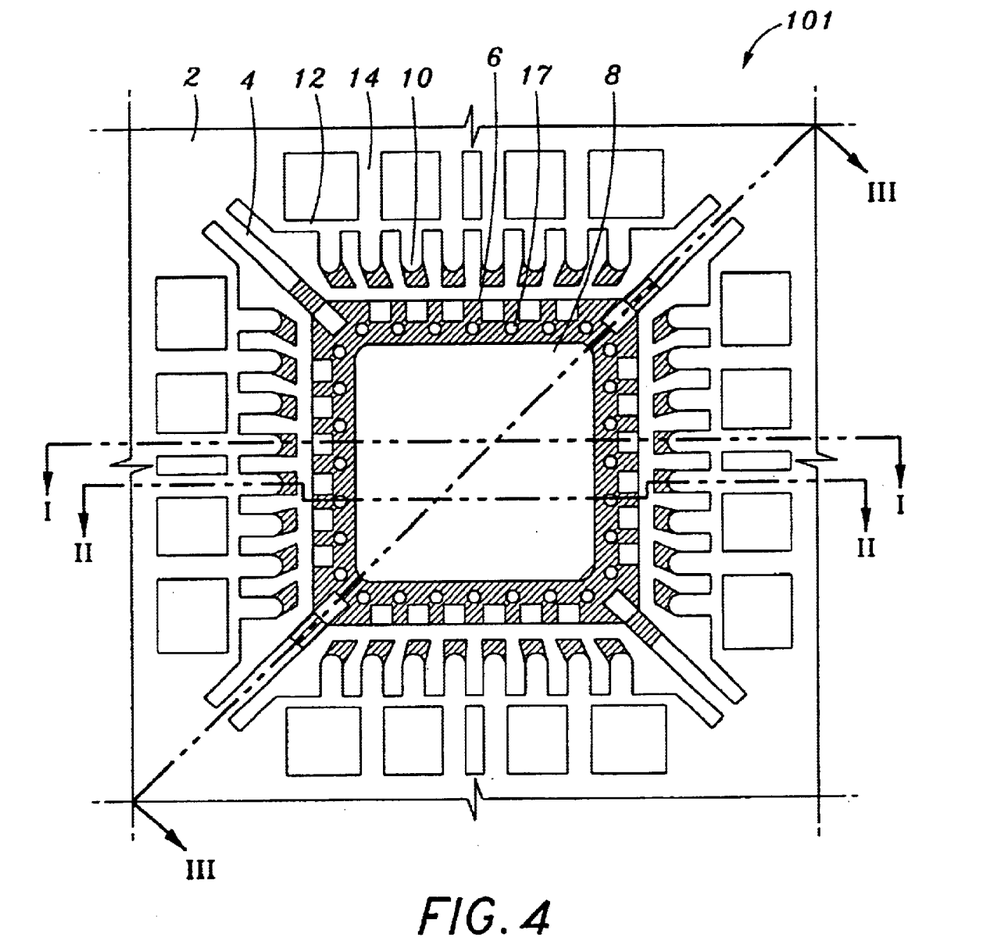
FIG. 4 is a bottom plan view of the lead frame shown in FIG. 3.

Referring now to FIGS. 3 and 4, there is depicted top and bottom plan views, respectively, of a lead frame 101 constructed in accordance with a second embodiment of the present invention. The lead frame 101 illustrated in FIGS. 3 and 4 is substantially similar in construction to the lead frame 100 shown in FIGS. 1 and 2, with the primary distinction being that apertures or holes 17 are formed between the chip mounting board 8 and the ground ring 6 as an alternative to the above-described slots 16. More particularly, seven holes 17 are formed between each side of the chip mounting board 8 and the corresponding side of ground ring 6. However, the number of holes 17 need not necessarily be restricted to seven. Though the boundary between the chip mounting board 8 and the ground ring 6 is not as defined when holes 17 are employed as an alternative to the slots 16, that portion of the lead frame 101 outside of the holes 17 is defined as the ground ring 6 in FIGS. 3 and 4. In FIG. 4, the hatched portions in the drawing indicates partially etched portions of the lead frame 101, and is also described as third surfaces below.

Figure 5:
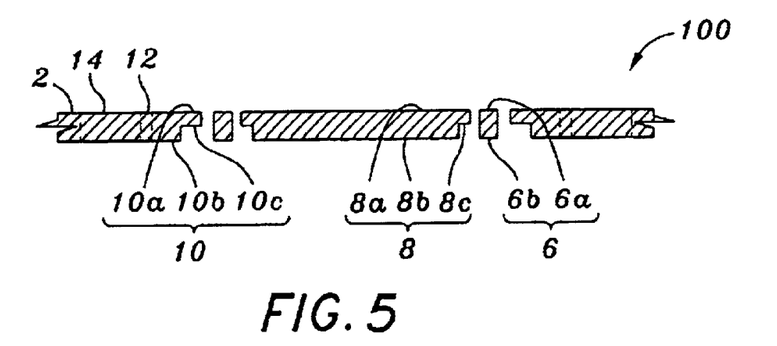
FIG. 5 is a cross-sectional view taken along lines I—I of FIGS. 1–4.
Figure 6:
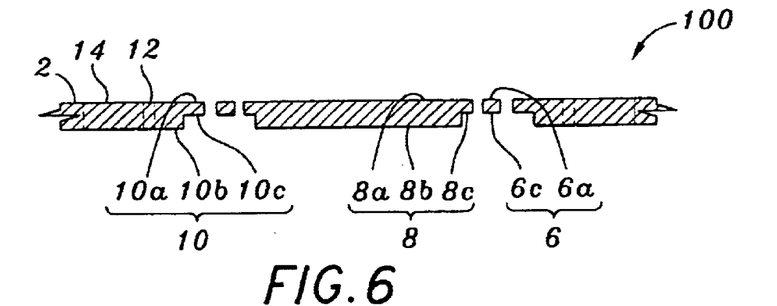
FIG. 6 is a cross-sectional view taken along lines II—II of FIGS. 1–4.
Figure 7:
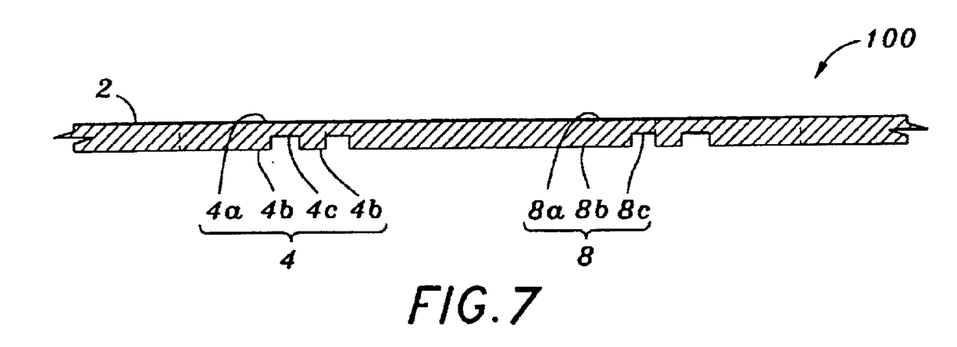
FIG. 7 is a cross-sectional view taken along lines III—III of FIGS. 1–4.

Referring now to FIGS. 5–7, the chip mounting board 8 of the lead frame 100, 101 includes a substantially flat or planar first surface 8a. In addition to the first surface 8a, the chip mounting board 8 defines substantially flat or planar second and third surfaces 8b, 8c which are opposed to the first surface 8a. The third surface 8c circumvents the second surface 8b, and is formed between the first and second surfaces 8a, 8b, i.e., the third surface 8c is depressed (perpendicularly recessed) or partially etched in a predetermined depth relative to the second surface 8b. As indicated above, the third surface 8c circumvents the second surface 8b.

The ground ring 6 of the lead frame 100, 101 extends about the periphery of the chip mounting board 8 and is spaced therefrom by a predetermined distance (i.e., the width of each slot 16 or diameter of each hole 17). The ground ring 6 includes a substantially flat or planar first surface 6a. In addition to the first surface 6a, the ground ring 6 defines a substantially flat or planar second surface 6b, and a plurality of substantially flat or planar third surfaces 6c. The second and third surfaces 6b, 6c are each opposed to the first surface 6a, with the third surfaces 6c being formed between the first and second surfaces 6a, 6b, i.e., depressed or partially etched in a predetermined depth so as to be perpendicularly recessed relative to the second surface 6b. Each of the third surfaces 6c is typically formed in a convex or concave form within the second surface 6b. The ground ring 6 further includes a plating layer (not shown) of a predetermined thickness applied to the first surface 6a thereof. The plating layer, which may be formed from silver or gold, provides excellent bonding with a conductive wire during a subsequent fabrication step for the semiconductor package 200. As indicated above, a plurality of slots 16 or holes 17 are disposed between the chip mounting board 8 and the ground ring 6, though no corresponding reference numerals are included in FIGS. 5–7.

With regard to the leads 10 located about the periphery of the ground ring 6, each of the leads 10 includes a generally flat or planar first surface 10a, and substantially flat or planar second and third surfaces 10b, 10c which are opposed to the first surface 10a. The third surface 10c is located at the distal end of the lead 10 closer to the ground ring 6 than the second surface 10b. Additionally, the third surface 10c is formed between the first and second surfaces 10a, 10b, i.e., is depressed or partially etched in a predetermined depth so as to be perpendicularly recessed relative to the second surface 10b. Each lead 10 preferably has a plating layer of a predetermined thickness applied to the first surface 10a thereof. The plating layer may comprise a metal such as silver or gold, and like the plating layer of the ground ring 6, provides excellent bonding with a conductive wire. As indicated above, the leads 10 of the lead frame 100, 101 are each connected to a dambar 12, with each dambar 12 being connected to the frame 2 via the supporting leads 14.

Each tie bar 14 defines a substantially flat or planar first surface 4a, and substantially flat or planar second and third surfaces 4b, 4c which are each opposed to the first surface 4a. The third surface 4c is depressed or partially etched in a predetermined depth so as to be perpendicularly recessed relative to the second surface 4b. Each tie bar 4 may itself include a plating layer of a predetermined thickness applied to the first surface 4a thereof, with the plating layer being formed from metal such as silver or gold to provide superior bonding with a conductive wire as will be described in more detail below.

The lead frame 100, 101 is manufactured by mechanically stamping or chemically etching a continuous metal strip. The metal strip may be fabricated from copper, copper alloy, alloy 37 (37% nickel, 55% iron), or similar materials. A manufacturing method for the lead frame 100, 101 will be described in more detail below with reference to a manufacturing method for the semiconductor package 200.

Figure 8:
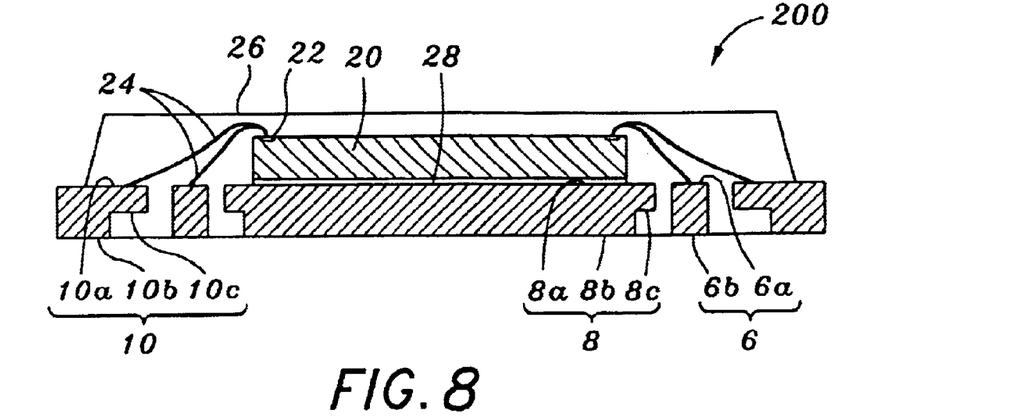
FIG. 8 is a cross-sectional view of a semiconductor package constructed in accordance with the present invention.
Figure 9:
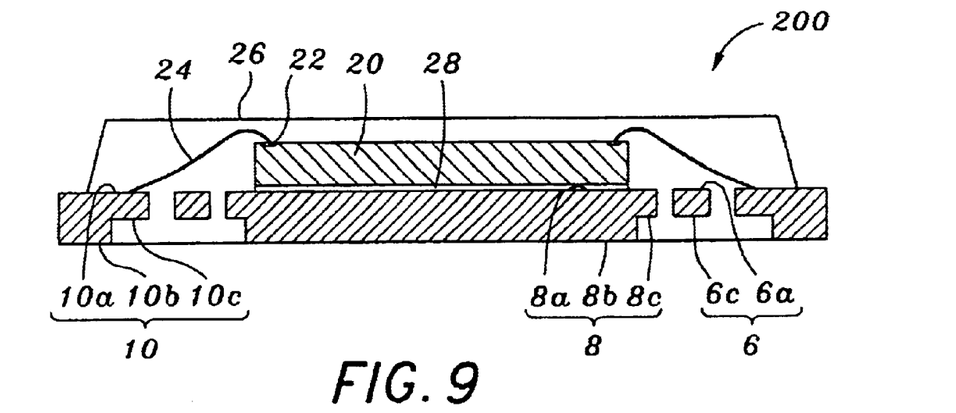
FIG. 9 is a cross-sectional view of a semiconductor package constructed in accordance with the present invention.
Figure 10:
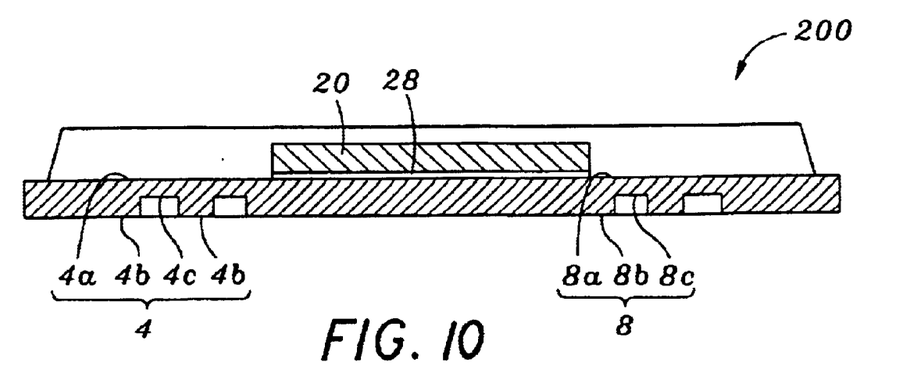
FIG. 10 is a cross-sectional view of a semiconductor package constructed in accordance with the present invention.
Figure 11:
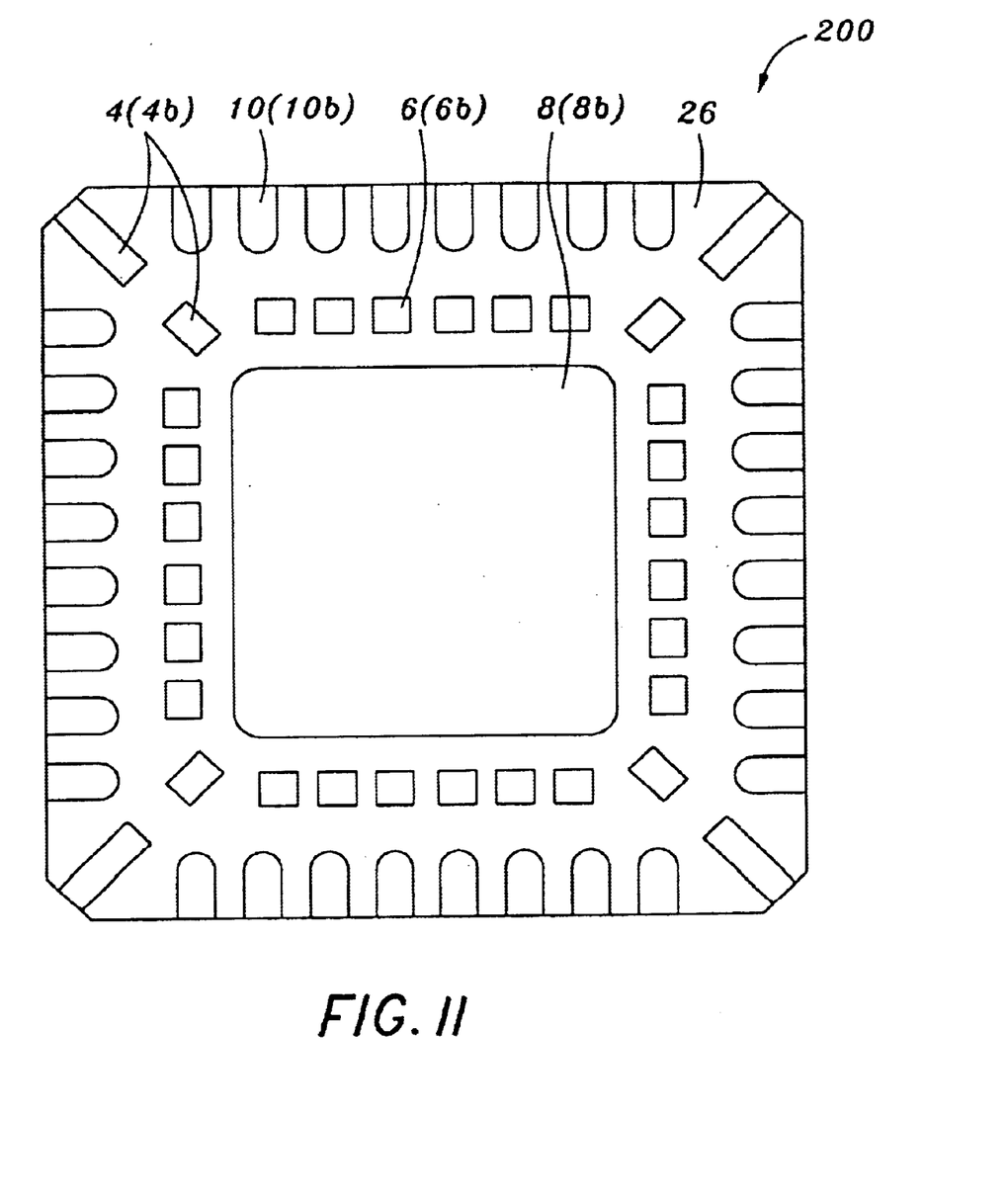
FIG. 11 is a bottom plan view of a semiconductor package constructed in accordance with the present invention.

Referring now to FIGS. 8–11, there is shown the semiconductor package 200 constructed in accordance with the present invention. As indicated above, FIGS. 8–10 provide cross-sectional views of the semiconductor package 200, with a bottom plan view being shown in FIG. 11. The semiconductor package 200 of the present invention may include either the lead frame 100 of the first embodiment or the lead frame 101 of the second embodiment. The structural attributes of the lead frame 100, 101 are discussed above in relation to FIGS. 1–7.

In the semiconductor package 200, a semiconductor chip 20 having a plurality of input-output pads 22 is bonded to the first surface 8a of the chip mounting board 8 through a layer 28 of bonding adhesive. The input-output pads 22 of the semiconductor chip 20 and the first surfaces 6a, 10a of the ground ring 6 and each lead 10, respectively, are mechanically and electrically connected to each other through the use of conductive wires 24. The conductive wires 24 are each typically fabricated from gold or aluminum. The conductive wires 24 connected to respective ones of the leads 10 are typically used for power supply or for signal transmission, with the conductive wires 24 connected to the ground ring 6 being used for grounding the semiconductor chip 20. The conductive wires 24 are preferably bonded only to those portions of the first surface 6a of the ground ring 6 which are disposed in opposed relation to the second surface 6b, i.e., those portions of the first surface 6a which are not opposed to the third surfaces 6b. Thus, the conductive wires 24 are only bonded to those portions of the ground ring 6 of maximum thickness, and are not bonded to those portions of the ground ring 6 of reduced thickness attributable to the formation of the recesses defining the third surfaces 6c therein. As will be discussed in more detail below, the bonding of the conductive wires 24 to only those regions of the ground ring 6 of maximum thickness is for purposes of minimizing the bouncing phenomenon of the ground ring 6 described above during the wire bonding process.

In the semiconductor package 200, the chip mounting board 8, the tie bars 4, the ground ring 6, the leads 10, the semiconductor chip 20 and the conductive wires 24 are all sealed with a sealing material which, when hardened, forms a sealing part 26 of the semiconductor package 200 of a specific form. The second surfaces 8b, 4b, 6b, 10b of the chip mounting board 8, tie bars 4, ground ring 6 and leads 10, respectively, are exposed within the outer surface of the sealing part 26. That is, the first surfaces 8a, 4a, 6a, 10a, the third surfaces 8c, 4c, 6c, 10c, and each of the peripheral edges or sides of the chip mounting board 8, tie bars 4, ground ring 6 and leads 10 are located within or encapsulated by the sealing part 26, and thus interlocked thereto. The second surfaces 8b, 4b, 6b, 10b of the chip mounting board 8, tie bars 4, ground ring 6 and leads 10 which are exposed within the sealing part 26 may be mounted to an underlying substrate such as a motherboard or printed circuit board (PCB) at a later time. As indicated above, the second surfaces 8b, 4b, 6b, 10b of the chip mounting board 8, tie bars 4, ground ring 6 and leads 10 exposed within the sealing part 26 may have a plating layer (not shown) of a predetermined thickness plated thereon, with such plating layer typically being a metal such as copper, gold, solder, tin, nickel, palladium, or others.

In the semiconductor package 200, the second surfaces 10b, 6b, 4b of the leads 10, ground ring 6, and tie bars 4 are mounted to a prescribed, corresponding pattern on a printed circuit board or motherboard. However, to improve the heat dissipation performance of the semiconductor package 200, the second surface 8b of the chip mounting board 8 (which is also exposed) may also be mounted to the corresponding pattern on the motherboard through the use of a solder paste.

Figure 12:
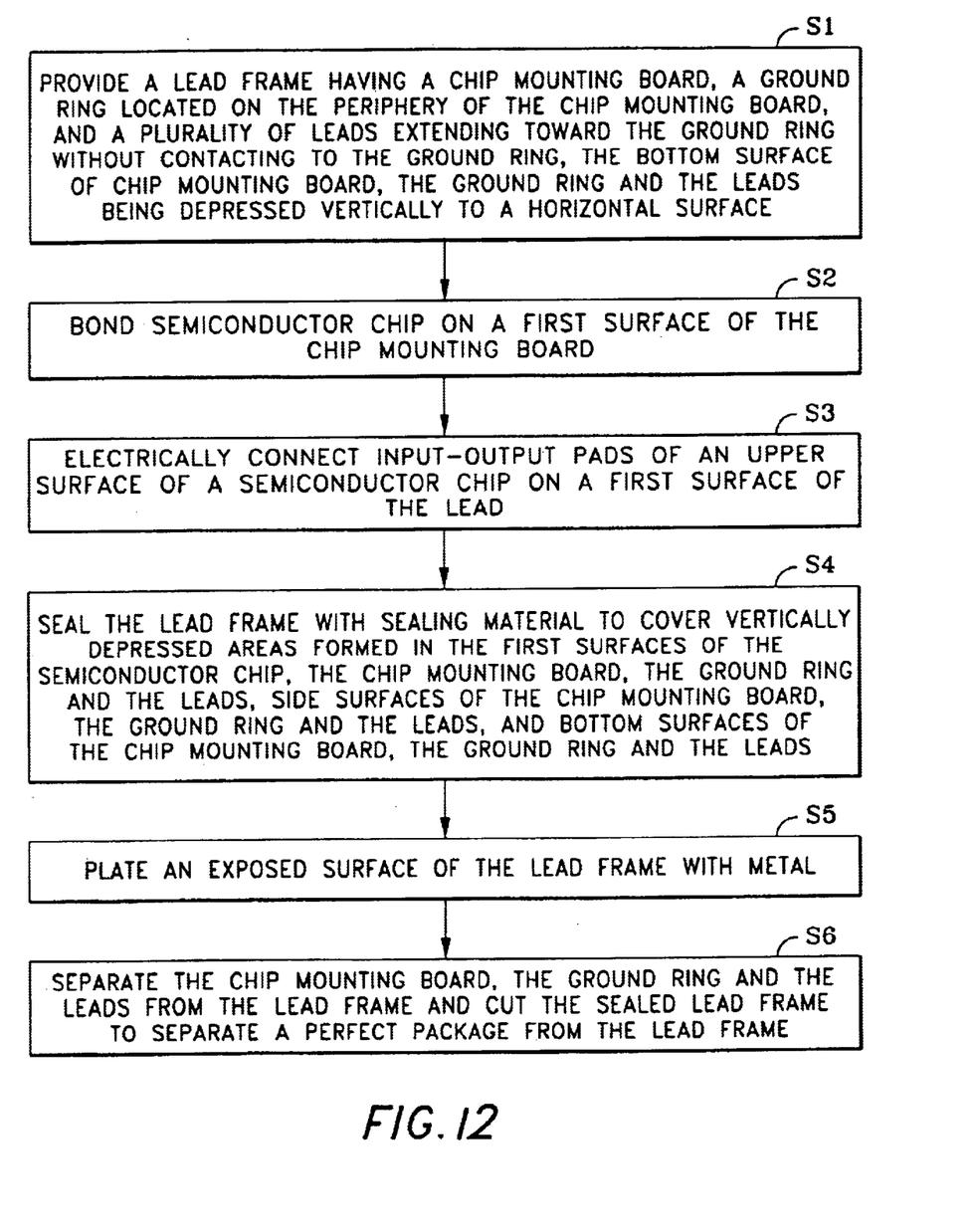
FIG. 12 is a flow diagram illustrating an exemplary manufacturing method for the semiconductor package of the present invention.

Referring now to FIG. 12, there is provided a flow chart which sets forth the six steps included in the manufacturing method for the semiconductor package 200 of the present invention. As indicated above, FIGS. 13–18 provide illustrations corresponding to each of the steps described in FIG. 12. In the manufacturing method, the first step S1 is the step of preparing the lead frame 100, 101. The lead frames 100, 101 are each formed by chemical wet etching a metal strip. The chemical etching uses photolithography, photoresist and chemical solutions for etching a pattern on the metal strip. Generally, a photoresist layer is formed on one side or two sides of the strip. Next, the photoresist layer is exposed to light through a mask on which a desired pattern is formed. Chemical solution is continuously applied to one or two sides of the strip. The exposed area of the strip is etched and removed, thus causing the desired pattern to remain on the strip.

Figure 13:
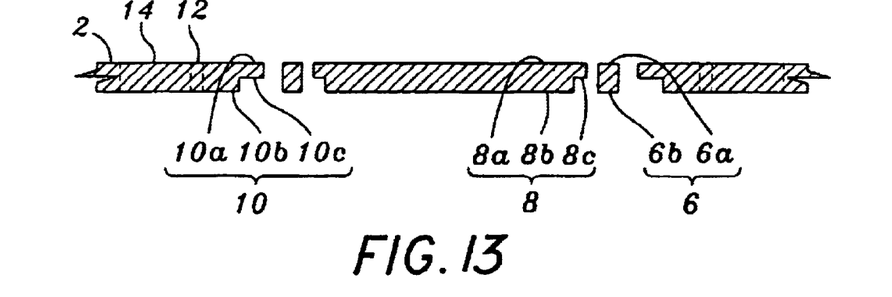
FIGS. 13–18 are illustrations of respective ones of the steps set forth in FIG. 12.

By performing the etching twice, the lead frames 100, 101 of the first and second embodiments of the present invention may be formed. The first etching step is carried out on one or two sides of the strip along the photoresist pattern thereon, and by completely passing through a predetermined area of the metal strip in order to form the entire pattern on the lead frames 100, 101. Next, a second photoresist pattern is formed on a predetermined area of one side of the lead frame 100, 101. The circumferential area of the chip mounting board 8 and selected areas of the ground ring 6, tie bars 4, and leads 10 are not wrapped by the second photoresist pattern, and therefore may be etched more by a second etching step which is carried out on one side of the lead frames 100, 101 along the second photoresist pattern. In the second etching step, the depressed surfaces are formed in the lead frames 100, 101, i.e., the third surface 8c of the chip mounting board 8, the third surfaces 6c of the ground ring 6, the third surface 4c of each of the tie bars 4, and the third surface 10c of each of the leads 10. When the chemical solution etches such depressed surfaces to the prescribed depth, the second etching step is discontinued. That is, the second etching step is carried out in a manner such that the distance separating the third surface 8c of the chip mounting board 8 from the second surface 8b thereof, the distance separating the third surfaces 6c of the ground ring 6 from the second surface 6b thereof, the distance separating the third surface 4c of each tie bar 4 from the second surface 4b thereof, and the distance separating the third surface 10c of each of the leads 10 from the second surface 10b thereof allows a sufficient amount of sealing material (used to form the sealing part 26) to flow under the third surfaces 8c, 6c, 4c, 10c as needed to firmly secure the chip mounting board 8, ground ring 6, tie bars 4 and leads 10 to the sealing part 26.

In general, in the second etching step, the thickness between the first surfaces 8*a*, 6*a*, 4*a*, 10*a* and respective ones of the third surfaces 8*c*, 6*c*, 4*c*, 10*c* is in the range of from about twenty-five percent to about seventy-five percent (and preferably about fifty percent) of the thickness of the chip mounting board 8, ground ring 6, tie bars 4, and leads 10 between the first surfaces 8*a*, 6*a*, 4*a*, 10*a* and respective ones of the second surfaces 8*b*, 6*b*, 4*b*, 10*b* thereof. Due to the incompleteness of the second etching step, the third surfaces 4*c*, 6*c*, 8*c*, 10*c* may not be perfectly planar. Additionally, the corners defined between the second surfaces 8*b*, 6*b*, 4*b*, 10*b* and respective ones of the third surfaces 8*c*, 6*c*, 4*c*, 10*c* may not define an angle of ninety degrees, but rather may be rounded.

Those of ordinary skill in the art will recognize that the first and second etching steps may be changed in order, and that specific objects of the present invention may be achieved through the implementation of only the first etching step. That is, the pattern of the leads 10 may be formed by the first etching step, with the chip mounting board 8, the ground ring 6, the tie bars 4 and the leads 10 being etched over a prescribed thickness to form the same, and each including a stepped section. Alternatively, the lead frames 100, 101 may be formed by a first step wherein the whole pattern of the lead frames 100, 101 is formed by stamping, followed by a second step of chemically etching the chip mounting board 8, the ground ring 6, the tie bars 4, and the leads 10 of the stamped lead frame to form the depressed surfaces.

Figure 14:
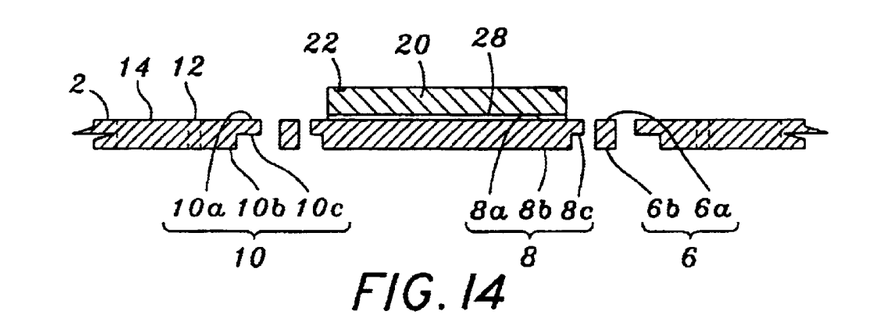

Referring now to FIGS. 12 and 14, the second step S2 of the manufacturing method is a chip mounting and bonding step. More particularly, the semiconductor chip 20 which includes the input-output pads 22 formed on the upper surface thereof is bonded to the approximate center of the first surface 8*a* of the chip mounting board 8 through the use of a layer 28 of a bonding adhesive. The mounting and bonding of the semiconductor chip 20 to the chip mounting board 8 may be accomplished through the use of typical semiconductor chip bonding equipment and a typical semiconductor chip bonding epoxy. During the semiconductor chip bonding step and a semiconductor chip assembling step (which will be described later), the lead frame 100, 101 is grounded in such a manner that the same is protected from electrostatic discharge (ESD).

Figure 15:
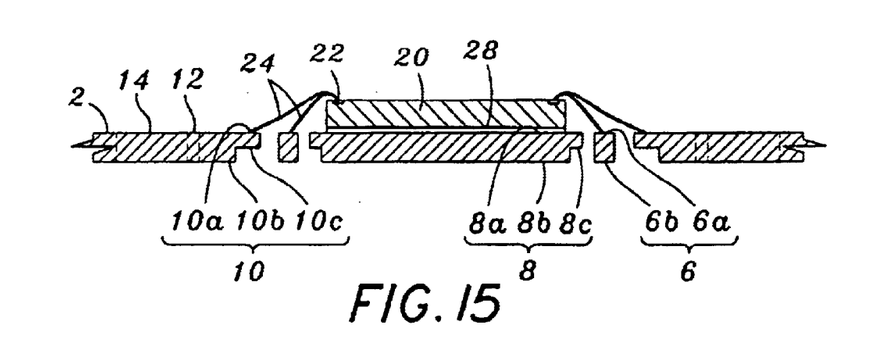

Referring now to FIGS. 12 and 15, the third step S3 of the present manufacturing method is a wire bonding step. As shown in FIG. 15, in the wire bonding step, each input-output pad 22 on the upper surface of the semiconductor chip 20 is mechanically and electrically connected to respective ones of the first surfaces 6*a*, 4*a*, 10*a* of the ground ring 6, tie bars 4 and leads 10 through the use of the conductive wires 24 which, as indicated above, are typically fabricated from gold or aluminum. The first surfaces 6*a*, 4*a*, 10*a* can be plated with gold, silver, nickel, palladium, copper or other metals. During this wire bonding step, the lead frame 100, 101 is grounded to prevent a malfunction of the semiconductor chip 20 due to electrostatic discharge. Additionally, during the wire bonding process, the lead frames 100, 101 are preferably located on an upper portion of a heat block (not shown). The second surface 6*b* of the ground ring 6 remains fixed on the heat block without bouncing during the wire bonding process. Thus, the conductive wires 24 can be stably bonded to the first surface 6*a* of the ground ring 6. As indicated above, the conductive wires 24 are preferably bonded to those portions of the first surface 6*a* which are disposed in opposed relation to the second surface 6*b*, i.e., the surface in direct contact with the heat block. The conductive wires 24 mechanically and electrically connected to the ground ring 6 are for ground use. That is, the ground input-output pads 22 of the semiconductor chip 20 are electrically connected to the ground ring 6 and the tie bars 4 by certain ones of the conductive wires 24. The input-output pads 22 for power supply or for signal transmission are mechanically and electrically connected to respective ones of the leads 10 by the conductive wires 24.

Figure 16:
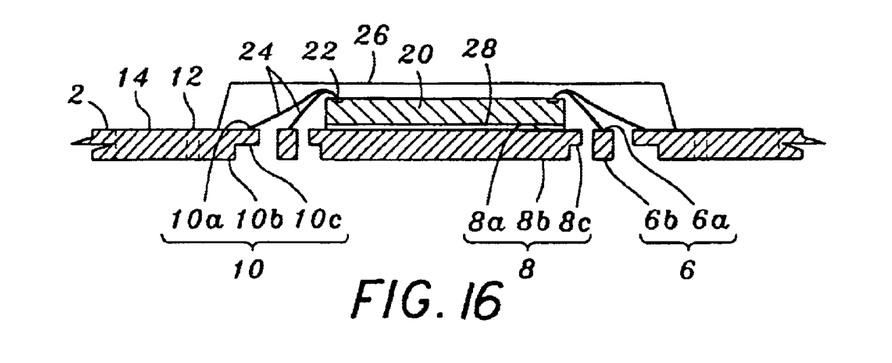
Figure 17:
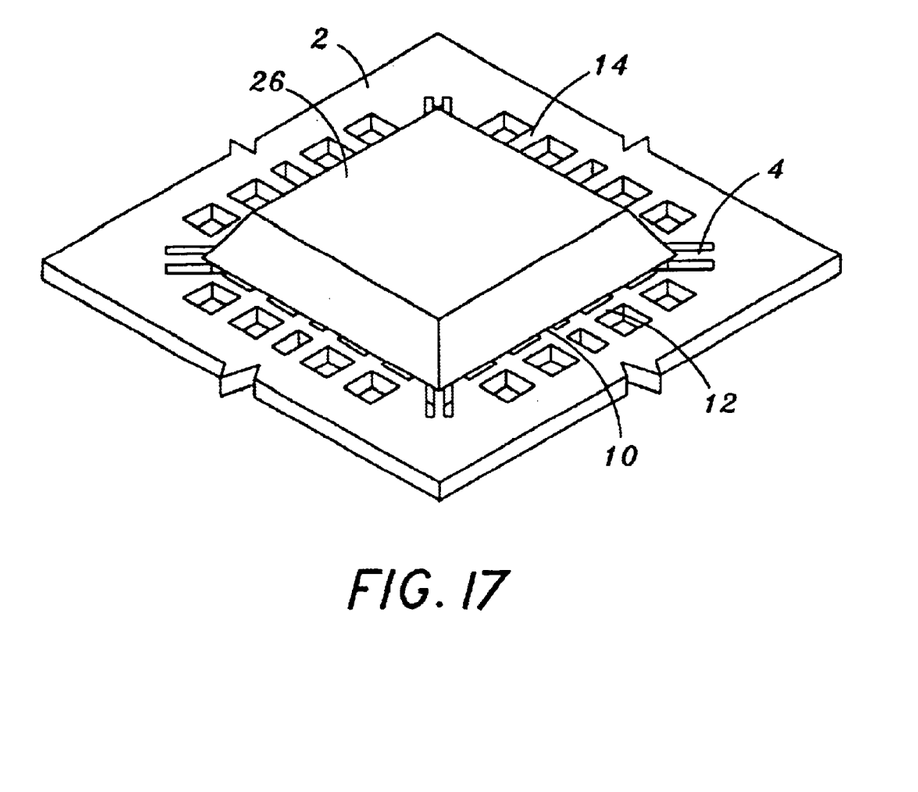

Referring now to FIGS. 12 and 16, a fourth step S4 in the present manufacturing method is a sealing step. As shown in FIGS. 16 and 17, a sealing material is applied to the lead frame 100, 101 to form the sealing part 26 of a prescribed form. The sealing part 26 covers the semiconductor chip 20, the conductive wires 24, the first and third surfaces 8*a*, 8*c* and peripheral edges or side surfaces of the chip mounting board 8, the first and third surfaces 6*a*, 6*c* and peripheral edges or side surfaces of the ground ring 6, the first and third surfaces 4*a*, 4*c* and peripheral edges or side surfaces of the tie bars 4, and the first and third surfaces 10*a*, 10*c* and peripheral edges or side surfaces of the leads 10. As indicated above, the second surfaces 8*b*, 6*b*, 4*b*, 10*b* of the chip mounting board 8, ground ring 6, tie bars 4 and leads 10 are exposed within the outer surface of (are not covered by) the sealing part 26.

The sealing step may be performed through the use of various methodologies according to application field. For example, the sealing step can be achieved through a general plastic sealing technique. In such technique, the lead frame 100, 101 is located in the inside of a mold, and the sealing part 26 of the prescribed shape is formed on the upper surface of the lead frame 100, 101 by the hardening of the sealing material injected into the mold. The sealing material may be an epoxy molding compound. A common gate can be formed on the lead frame 100, 101 to perform the sealing step smoothly. A side of the mold may be tapered, so that the sealing part 26 can be easily removed from within the mold.

An alternative sealing process could employ the use of a liquid type sealing material. If a liquid type sealing material is to be used, a first step of the sealing process would involve the placement of the lead frame 100, 101 onto a horizontal surface. In a second step, a common contact bead of hardenable adhesive material (e.g., a liquid-type sealing material) can be coated on the lead frame 100, 101 to form a closed angle dam at a predetermined area of the leads 10 along the circumference of the semiconductor chip 20. In a third step, the dam is hardened through a process such as heating at a temperature of about 140° Celsius for one hour. In a fourth step, the hardenable adhesive material is coated in the inside of the dam to form the complete sealing part. In the final step, the sealing part is hardened and formed on the lead frame 100, 101 by heating at a temperature of about 140° Celsius for about one hour.

In the fifth step S5 of the present manufacturing method, specific areas of the lead frame 100, 101 which are not covered with the sealing part 26 and include the second surfaces 8*b*, 6*b*, 4*b*, 10*b* of the chip mounting board 8, ground ring 6, tie bars 4 and leads 10, respectively, may be plated with the common plating metal which itself can be mounted to the motherboard. Examples of a suitable plating metal include gold, nickel, palladium, inconel, solder of lead and tin, or tantalum according to the application field. The plating step may be omitted if the metal used for forming the lead frame 100, 101 does not require the plating or a pre-plating. For example, the plating step may be omitted in the event that the metal strip used for manufacturing the lead frame 100, 101 is copper plated with nickel palladium.

Figure 18:
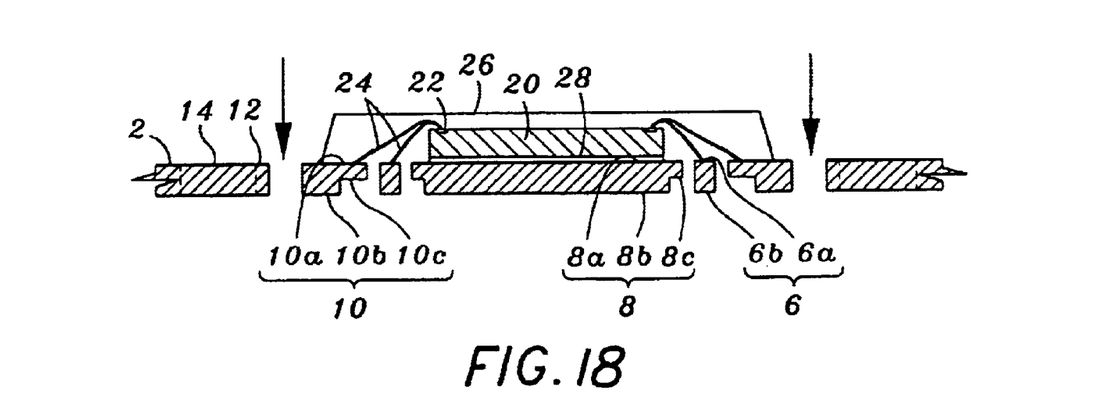

Referring now to FIGS. 12 and 18, a sixth step S6 of the present manufacturing method is a singulation step. In the singulation step, the lead frame 100, 101 on which the sealing part 26 is formed is itself cut. That is, a specific area of each of the leads 10 which is inside of the corresponding dambar 12 is cut. The cutting is carried out by completely passing the second surface 10b of each of the leads 10. Furthermore, each of the tie bars 4 on the outside of the sealing part 26 is also cut. Finally, all areas which are positioned between the lead frame 100, 101 and the sealing part 26 are removed during the singulation step.

The singulation step can be carried out using a punch, a saw, or an equivalent cutting tool. For example, the punch or saw can be used in the outside of the sealing part 26. If the punch is used, the semiconductor package 200 can be completely cut from the lead frame 100, 101 by one punching motion. It is contemplated that the cutting of the leads 10 and tie bars 4 within the dambars 12 in the punching operation may occur when the lead frame 100, 101 is turned over, i.e., flipped over from the orientation shown in FIG. 18. The cutting position can change the cut areas of each of the leads 10 or the tie bars 4 (which each extend to side surfaces of the sealing part 26) from about 0.0 to about 0.5 millimeters.

In the semiconductor package 200 including the lead frame 100 or the lead frame 101 and the corresponding manufacturing method, the conductive wires 24 for ground are bonded to those sections of the first surface 6a of the ground ring 6 corresponding to the second surface 6b, i.e., the surface in direct contact to the heat block during the wire bonding process, thereby restricting the bouncing phenomenon of the ground ring 6 during the wire bonding process. Therefore, the wire bonding is optimally performed, thereby improving the yield rate associated with the process. As indicated above, the present invention improves the yield rate of the wire bonding process due to the avoidance of the bouncing phenomenon as a result of not attempting to perform the wire bonding on those portions of the first surface 6a of the ground ring 6 corresponding to (i.e., disposed in opposed relation to) the third surfaces 6c which do not contact and are spaced from the heat block.

Moreover, in accordance with the present invention, the first and third surfaces 8a, 8c of the chip mounting board 8, the first and third surfaces 10a, 10c of each of the leads 10, and the first and third surfaces 6a, 6c of the ground ring 6 are located inside of (are encapsulated by) the sealing part 26, thereby improving the bonding strength between the chip mounting board 8, leads 10, ground ring 6 and the sealing part 26. Since, in the present invention, the first and third surfaces 6a, 6c of the ground ring 6 are located inside the sealing part 26, and the ground ring 6 is connected to the chip mounting board 8 (via the tie bars 4), the bonding strength between the chip mounting board 8 and the sealing part 26 is improved over semiconductor packages known in the prior art.

Moreover, in the semiconductor package 200 of the present invention, the ground ring 6 (as opposed to the leads 10) is used as the vehicle for grounding the semiconductor chip 20, thereby having the effect of making more of the leads 10 available for processing signal from the semiconductor chip 20. More particularly, the input-output pads 22 of the semiconductor chip 20 for ground are all bonded not to the leads 10, but to the ground ring 6, thus allowing all of the leads 10 of the lead frame 100, 101 to be used for the remaining input-output pads 22 for power supply and/or for signal transmission. Therefore, it is not necessary to manufacture the lead frame 100, 101 as a fine-pitched lead frame or a large-sized lead frame as occurs in the prior art as explained above.

This disclosure provides exemplary embodiments of the present invention. The scope of the present invention is not limited by these exemplary embodiments. Numerous variations, whether explicitly provided for by the specification or implied by the specification, such as variations in structure, dimension, type of material or manufacturing process may be implemented by one of skill in the art in view of this disclosure.

What is claimed is:

1. A lead frame comprising:
   a frame;
   a ground ring disposed within the frame and defining:
      a generally planar first ground ring surface;
      a generally planar second ground ring surface disposed in opposed relation to the first ground ring surface; and
      a plurality of third ground ring surfaces formed between the first and second ground ring surfaces in opposed relation to the first ground ring surface;
   a chip mounting board disposed within the ground ring;
   a plurality of tie bars connected to and extending between the frame, the ground ring and the chip mounting board for supporting the ground ring and the chip mounting board within the frame; and
   a plurality of leads connected to the frame and extending about the periphery of the ground ring in spaced relation thereto.

2. The lead frame of claim 1 wherein the chip mounting board defines:
   a generally planar first board surface;
   a generally planar second board surface disposed in opposed relation to the first board surface; and
   a third board surface formed between the first and second board surfaces in opposed relation to the first board surface, the third board surface circumventing the second board surface.

3. The lead frame of claim 2 wherein each of the tie bars defines:
   a generally planar first tie bar surface;
   a generally planar second tie bar surface disposed in opposed relation to the first tie bar surface; and
   a third tie bar surface formed between the first and second tie bar surfaces in opposed relation to the first tie bar surface, the third tie bar surface being disposed between the frame and the ground ring.

4. The lead frame of claim 2 wherein each of the leads defines:
   a generally planar first lead surface;
   a generally planar second lead surface disposed in opposed relation to the first lead surface; and
   a third lead surface formed between the first and second lead surfaces in opposed relation to the first lead surface, the third lead surface being oriented closer to the ground ring than the second lead surface.

5. The lead frame of claim 1 further comprising a plurality of slots formed between the ground ring and the chip mounting board.

6. The lead frame of claim 1 further comprising a plurality of holes formed between the ground ring and the chip mounting board.

7. A semiconductor package comprising:
   a lead frame comprising:
      a frame;
      a ground ring disposed within the frame and defining:

a generally planar first ground ring surface;

a generally planar second ground ring surface disposed in opposed relation to the first ground ring surface; and a plurality of third ground ring surfaces formed between the first and second ground ring surfaces in opposed relation to the first ground ring surface;

a chip mounting board disposed within the ground ring;

a plurality of tie bars connected to and extending between the frame, the ground ring and the chip mounting board for supporting the ground ring and the chip mounting board within the frame;

a plurality of leads connected to the frame and extending about the periphery of the ground ring in spaced relation thereto;

a semiconductor chip attached to the chip mounting board and including a plurality of input-output pads;

at least two conductive wires mechanically and electrically connecting respective ones of the input-output pads of the semiconductor chip to respective ones of the ground ring and the leads; and a sealing part for sealing the chip mounting board, the ground ring, the tie bars, the leads, the semiconductor chip and the conductive wires, the sealing part being configured such that the second surface of the ground ring is exposed therewithin.

8. The semiconductor package of claim 7 wherein the chip mounting board defines:

a generally planar first board surface;

a generally planar second board surface disposed in opposed relation to the first board surface; and a third board surface formed between the first and second board surfaces in opposed relation to the first board surface, the third board surface circumventing the second board surface;

the semiconductor chip being attached to the first board surface of the chip mounting board.

9. The semiconductor package of claim 8 wherein each of the tie bars defines:

a generally planar first tie bar surface;

a generally planar second tie bar surface disposed in opposed relation to the first tie bar surface; and a third tie bar surface formed between the first and second tie bar surfaces in opposed relation to the first tie bar surface, the third tie bar surface being disposed between the frame and the ground ring.

10. The semiconductor package of claim 9 wherein each of the leads defines:

a generally planar first lead surface;

a generally planar second lead surface disposed in opposed relation to the first lead surface; and a third lead surface formed between the first and second third lead surfaces in opposed relation to the first lead surface, the third lead surface being oriented closer to the ground ring than the second lead surface.

11. The semiconductor package of claim 10 wherein the sealing part is configured such that the second board surface of the chip mounting board, the second ground ring surface of the ground ring, the second tie bar surface of each of the tie bars, and the second lead surface of each of the leads are exposed therewithin.

12. The semiconductor package of claim 8 wherein the semiconductor chip is attached to the first board surface via an adhesive layer.

13. The semiconductor package of claim 7 wherein the conductive wire is connected to a portion of the first ground ring surface of the ground ring which is not disposed in opposed relation to any of the third ground ring surfaces.

14. The lead frame of claim 1 wherein:

the ground ring has a generally square configuration defining four segments; and the third ground ring surfaces are segregated into four sets which are disposed within respective ones of the four segments of the ground ring in equidistantly spaced intervals.

15. The lead frame of claim 14 wherein:

the chip mounting board has a generally square configuration defining four peripheral edge segments;

the segments of the ground ring extend along respective ones of the peripheral edge segments of the chip mounting board in spaced relation thereto; and the leads are segregated into four sets which extend toward respective ones of the segments of the ground ring.

16. The semiconductor package of claim 7 wherein:

the ground ring has a generally square configuration defining four segments; and the third ground ring surfaces are segregated into four sets which are disposed within respective ones of the four segments of the ground ring in equidistantly spaced intervals.

17. The semiconductor package of claim 16 wherein:

the chip mounting board has a generally square configuration defining four peripheral edge segments;

the segments of the ground ring extend along respective ones of the peripheral edge segments of the chip mounting board in spaced relation thereto; and the leads are segregated into four sets which extend toward respective ones of the segments of the ground ring.

18. A semiconductor package comprising:

a lead frame comprising:

a chip mounting board;

a ground ring circumventing the chip mounting board and defining:

a generally planar first ground ring surface;

a generally planar second ground ring surface disposed in opposed relation to the first ground ring surface; and a plurality of third ground ring surfaces formed between the first and second ground ring surfaces in opposed relation to the first ground ring surface; and a plurality of leads extending about the periphery of the ground ring in spaced relation thereto;

a semiconductor chip attached to the chip mounting board and electrically connected to at least one of the leads; and a sealing part at least partially covering the chip mounting board, the ground ring, the leads, and the semiconductor chip such that the second surface of the ground ring is exposed therein.

19. The semiconductor package of claim 18 wherein:

the chip mounting board defines opposed, generally planar first and second board surfaces;

each of the leads defines opposed, generally planar first and second lead surfaces; and the sealing part is configured such that the second board surface of the chip mounting board, the second ground ring surface of the ground ring, and the second lead surface of each of the leads are exposed therein.

20. The semiconductor package of claim 18 wherein:

the ground ring has a generally square configuration defining four segments; and the third ground ring surfaces are segregated into four sets which are disposed within respective ones of the four segments of the ground ring in equidistantly spaced intervals.

21. The semiconductor package of claim 20 wherein:

the chip mounting board has a generally square configuration defining four peripheral edge segments;

the segments of the ground ring extend along respective ones of the peripheral edge segments of the chip mounting board in spaced relation thereto; and the leads are segregated into four sets which extend toward respective ones of the segments of the ground ring.

* * * * *